United States Patent [19]

Kotowski

[11] Patent Number: 4,496,849
[45] Date of Patent: Jan. 29, 1985

[54] POWER TRANSISTOR PROTECTION FROM SUBSTRATE INJECTION

[75] Inventor: Thomas W. Kotowski, Norlesville, Ind.

[73] Assignee: General Motors Corporation, Detroit, Mich.

[21] Appl. No.: 350,757

[22] Filed: Feb. 22, 1982

[51] Int. Cl.³ .................. H01L 27/06; H02M 1/18; H03K 17/66
[52] U.S. Cl. .................. 307/254; 307/270; 357/48
[58] Field of Search .................. 307/246, 254, 270; 357/48, 86

[56] References Cited

U.S. PATENT DOCUMENTS

| | | | |
|---|---|---|---|
| 3,676,714 | 7/1972 | Wensink | 357/86 |
| 3,931,634 | 1/1976 | Knight | 357/86 |
| 3,995,307 | 11/1976 | Alcorn et al. | 307/254 |
| 4,079,271 | 3/1978 | Peil | 307/270 |
| 4,146,801 | 3/1979 | Vali et al. | 307/254 |
| 4,287,436 | 9/1981 | Tezuka et al. | 307/270 |
| 4,340,922 | 7/1982 | Delaporte | 357/86 |

OTHER PUBLICATIONS

Frederiksen et al., IEEE J. of Solid State Circuits, vol. SC 9, No. 6, Dec. 1974, pp. 394-403.

Primary Examiner—William D. Larkins
Attorney, Agent, or Firm—Robert J. Wallace

[57] ABSTRACT

A PN junction-isolated bipolar integrated circuit having a power transistor protected from delay in turn-off by a parasitic substrate injection. Protection is obtained by interposing an additional isolation pocket between an isolating pocket producing the substrate injection and an isolation pocket for an input transistor for the power transistor, and coupling the additional isolation pocket to the base of the power transistor.

5 Claims, 8 Drawing Figures

4,496,849

POWER TRANSISTOR PROTECTION FROM SUBSTRATE INJECTION

FIELD OF THE INVENTION

This invention relates to compensating for parasitic transistor action that delays turn-off of a power transistor in a PN junction-isolated monolithic integrated circuit. More specifically, it relates to protecting an output power transistor from substrate injection in an H-switch monolithic integrated circuit.

BACKGROUND OF THE INVENTION

It takes a finite period of time for a bipolar transistor to become nonconductive, i.e. turned off, when its base current is discontinued. The period of time it takes to drop from 90% to 10% of maximum conductivity I refer to herein as fall time. In power transistors, fall time is ordinarily inherently long enough in a discrete device. If the power transistor is incorporated in a monolithic integrated circuit, parasitic effects can increase fall time, i.e. delay in turn-off, even more.

In an H-switch, if one diagonal pair of power transistors in the circuit is not turned off before the other diagonal pair is turned on, the results can be damaging to the integrated circuit, as will hereinafter be more fully described. I have noted that if the H-switch is made as a PN junction-isolated monolithic integrated circuit, one transistor in each diagonal pair can form a parasitic driver transistor for both power transistors of the other diagonal pair by means of substrate injection. The substrate injection delays turn-off of both power transistors in the other leg. If the delay is long enough, both diagonal pairs can be conductive at the same time. In such event, a short circuit to ground is provided through one transistor of each diagonal pair. Such a short would produce failure of the circuit.

To protect such a circuit against failure, one must insure that the circuit operates with sufficient switching delay to accommodate the maximum parasitic action that will occur, no matter how infrequent it is expected. A better way is to operate the circuit without the switching delay but to include additional circuitry to protect against failure when the parasitic action occurs. I achieve such protection by means of a PN junction-isolated monolithic circuit of unique integrated geometry.

OBJECTS AND SUMMARY OF THE INVENTION

It is therefore a general object of this invention to provide a transistor having a faster turn-off in a PN junction-isolated monolithic integrated circuit.

Another object of the invention is to provide faster turn-off of a power transistor in a PN junction-isolated monolithic integrated circuit by compensating for parasitic substrate injection.

Still another object of the invention is to provide a PN junction-isolated monolithic integrated H-switch having integral protection from parasitic substrate injection.

The invention comprehends an H-switch in a PN junction isolated integrated circuit for energizing an inductive load. As usual, the H-switch has four load energizing transistors. The circuit additionally includes two lateral NPN transistors for each side of the H-switch for compensating for suppressing unwanted parasitic transistor action. The lateral transistors are formed by including four N-type isolation pockets in the monolithic integrated circuit layout, and coupling each isolation pocket with the base region of a respective load energizing transistor in the H-switch. Further, the four isolation pockets are uniquely interposed between the emitter and collector of the offending parasitic transistor. This integrally provides normally reverse-poled diodes with the isolation region of the circuit. They each form a collector of a separate lateral transistor. They not only collect some of the current injected into the substrate but also increase the separation between the load energizing transistors and their drive circuitry. This reduces the amount of current collected by the parasitic transistor. In addition, these added collectors are coupled to the bases of the load energizing transistors, which tend to turn them hard off, to compensate for any reduced parasitic transistor action that might still occur.

BRIEF DESCRIPTION OF THE DRAWING

Other objects, features and advantages of this invention will become more apparent from the following description of preferred embodiments thereof and from the drawing, in which.

DESCRIPTION OF THE PREFERRED EMBODIMENTS

Figure 1:
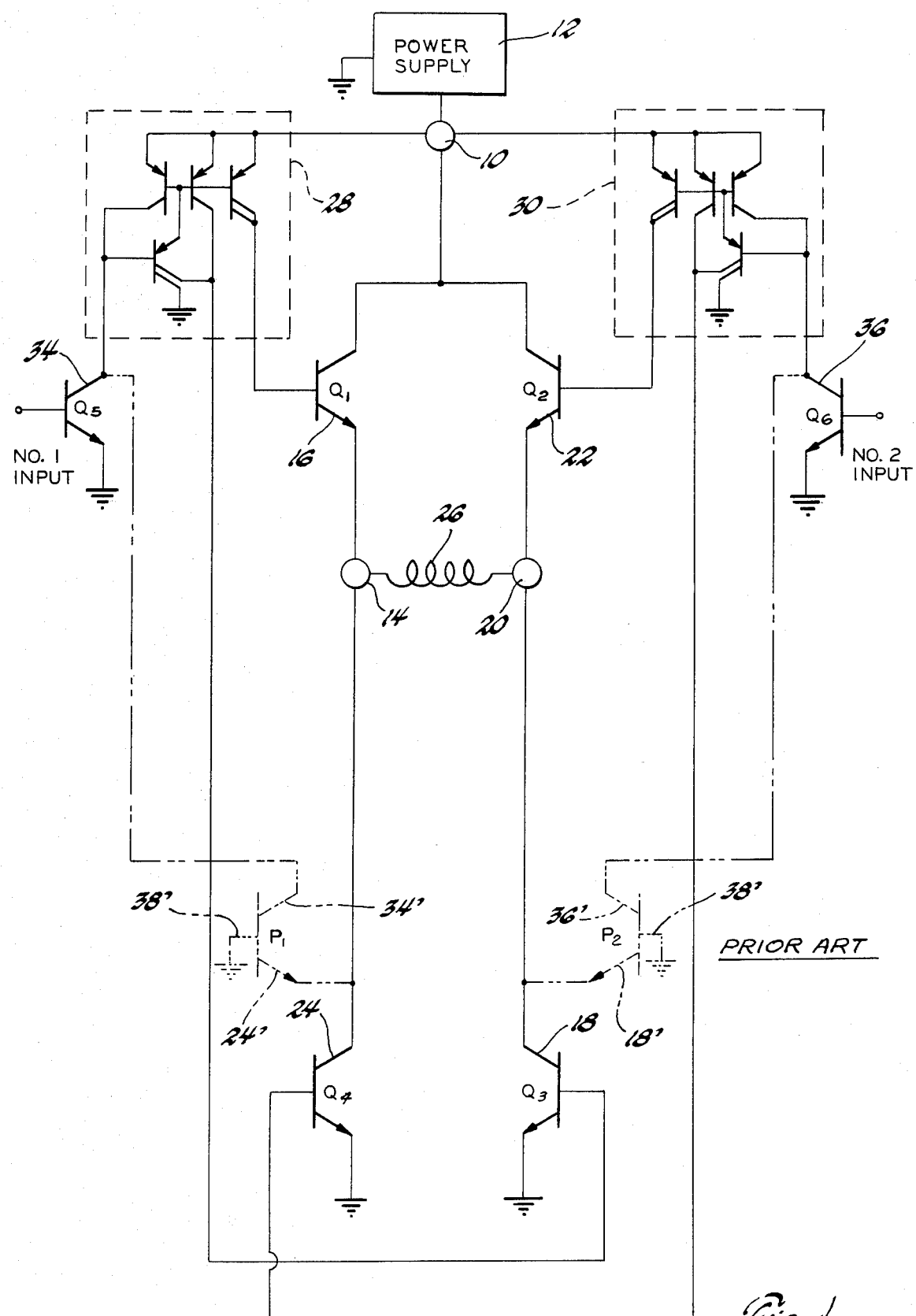
FIG. 1 is a schematic view showing a prior art H-switch electrical circuit for driving an inductive load.

Reference is now made to FIG. 1 of the drawing, which shows an electrical schematic for a prior art H-switch type of circuit. The circuit includes four NPN load energizing, i.e. power transistors $Q_1$, $Q_2$, $Q_3$ and $Q_4$ arranged in an H-switch configuration. By power transistor I mean a transistor capable of handling more than about one watt. In the arrangement shown, $Q_1$ and $Q_4$ are series coupled between a positive terminal 10 of a DC power supply 12 and ground, while $Q_2$ and $Q_3$ are analogously series coupled between the same positive terminal 10 of power supply 12 and ground. A first circuit output terminal 14 is provided between the emitter 16 of $Q_1$ and the collector 18 of $Q_3$. A second circuit output terminal 20 is provided between the emitter 22 of $Q_2$ and collector 24 of $Q_4$. An inductive load impedance 26 is coupled between the circuit output terminals 14 and 20. The inductive load impedance 26 may take the form, for example, of the winding of a DC motor.

The H-switch functions to couple the voltage between the power supply positive terminal 10 and ground across the load impedance 26 with the polarity of the voltage across the load impedance 26 being determined by selectively turning on the diagonal pairs of transistors $Q_1$ and $Q_3$ or $Q_2$ and $Q_4$. The load energizing transistor pair $Q_1$ and $Q_3$ are provided with an input transistor $Q_5$ and a first power mirror driver circuit 28 that is turned on by the input transistor $Q_5$. The first power mirror circuit is enclosed by the dashed line designated by reference numeral 28.

The load energizing transistor pair $Q_2$ and $Q_4$ are provided with a separate input transistor $Q_6$ and a second power mirror circuit 30 that is turned on by the input transistor $Q_6$. The second power mirror circuit is enclosed by a dashed line designated by reference numeral 30. While power mirror driving circuitry is preferred, it is just one example of means for turning on the respective transistor pairs $Q_1$ & $Q_3$ and $Q_2$ & $Q_4$.

Input signals are alternately applied to the input transistors $Q_5$ and $Q_6$, to alternately energize the transistor pairs $Q_1$ & $Q_3$ and $Q_2$ & $Q_4$. Means for alternately generating such input signals are not shown since they are not needed to illustrate this invention. In any event, when the input signal to $Q_5$ is terminated, a parasitic lateral NPN transistor $P_1$ is formed that tends to keep both $Q_1$ and $Q_3$ turned on. Analogously, a parasitic transistor $P_2$ is formed when $Q_6$ is turned off, that tends to keep both $Q_2$ and $Q_4$ turned on. When either of $Q_5$ or $Q_6$ is turned off, there is a polarity reversal between outputs 14 and 20, due to energy stored in the inductive load between them.

Figure 3:
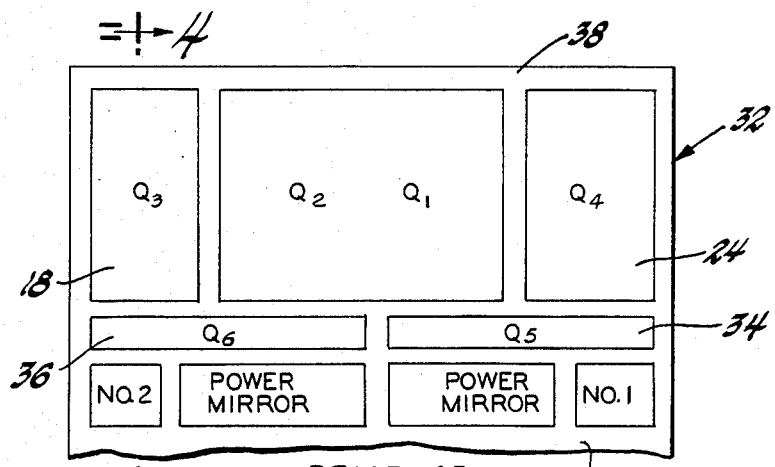
FIG. 3 is a fragmentary plan view showing a conventional layout for an H-switch as a PN junction isolated monolithic integrated circuit.
Figure 4:
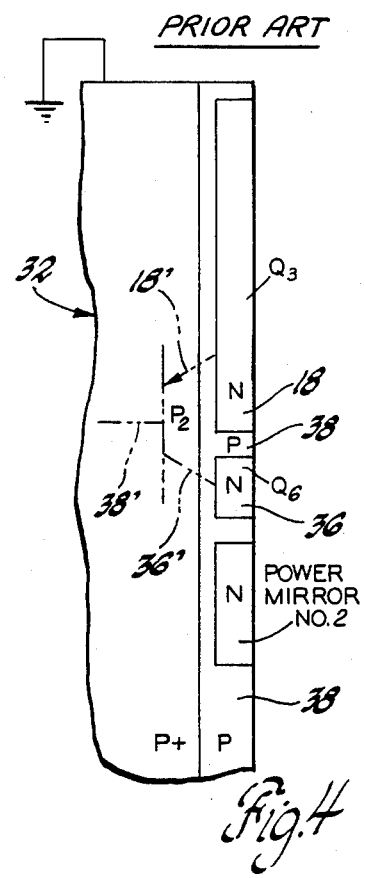
FIG. 4 is a sectional view taken along the line 4—4 of FIG. 3.

As can be seen by reference to FIGS. 3 and 4, each of transistors $Q_3$, $Q_4$, $Q_5$ and $Q_6$ are formed in a discrete PN junction isolation pocket. The N-type material forming their isolation pockets serves as their respective collectors 18, 24, 34 and 36. FIG. 3 is a fragmentary elevational view of the surface of a silicon chip 32, showing a typical isolation pocket layout for a PN junction isolated monolithic integration of the FIG. 1 circuit. A silicon oxide layer, which would normally cover this surface is not shown. In addition the isolation pockets 18, 24, 34 and 36, as well as that for $Q_1$ and $Q_2$, and both power mirrors, would contain island-like P-type regions in their surfaces and N-type island-like regions within the P-type islands, to form base and emitter regions for the vertical NPN transistors shown in the FIG. 1 schematic. Such additional regions are not shown to avoid distraction by details not essential to this invention. For analogous reasons, cross section lines are omitted from FIG. 4.

When an input signal is applied to the No. 2 input transistor $Q_6$, $Q_2$ and $Q_4$ are turned on and output terminal 20 becomes positive with respect to output terminal 14. When the input signal to $Q_6$ is discontinued, the energy stored in the inductive load impedance 26 will reverse this polarity. In such instance, the voltage on output terminal 20 will drop to below that which is applied to the P-type material 38 forming the isolation region between the isolation pockets 18, 24, 34 and 36. This drop in voltage forward biases collector pocket 18 of transistor $Q_3$ with respect to its surrounding isolation 38. The collector pocket 36 of $Q_6$ is spaced from collector pocket 18 by the isolation region 38 and remains reverse biased with respect to the isolation region 38. Hence, the collector 18 of $Q_3$ can serve as the emitter 18' of a parasitic lateral NPN transistor $P_2$, with the isolation region 38 serving as its base region 38' and collector 36 of $Q_6$ serving as its collector 36'. The parasitic transistor $P_2$ is shown in phantom line in FIGS. 1 and 4. Energy stored in the inductive load is injected into the substrate, i.e. the isolation region 38, until it is substantially dissipated. Since the collector of parasitic transistor $P_2$ is also the collector of input transistor $Q_6$, the substrate injected current it collects activates the No. 2 driver circuitry 30. Load $Q_2$ and $Q_4$ will thus stay turned on until the stored energy of the inductive load impedance 26 dissipates.

If an energizing signal is applied to the first input transistor $Q_5$ before the energy of the inductive load impedance is dissipated, transistors $Q_1$ and $Q_3$ will be turned on before transistors $Q_2$ and $Q_4$ are turned off. In such event, there is a direct short from the power supply terminal 10 to ground through transistors $Q_1$ and $Q_4$.

An analogous effect is produced upon turn-off of the transistors $Q_1$ and $Q_3$ if transistor $Q_6$ is turned on too soon. When $Q_5$ is turned off, a parasitic transistor $P_1$ is produced when the collector 24 of $Q_4$ goes below ground. It becomes more negative than its surrounding isolation 38 and injects current into it. This injected current can be collected by the adjacent N-type isolation pocket 34 which forms the collector of the input transistor $Q_5$. Thus a parasitic lateral NPN transistor is formed with collector 24 of $Q_4$ as its emitter 24', isolation region 38 as its base 38' and collector 34 of $Q_5$ as its collector 34'. The parasitically injected current thus can activate the No. 1 power mirror driver circuitry 28 and keep load energizing transistors $Q_1$ and $Q_3$ on until the stored inductive load energy dissipates.

In my invention I recognize that the parasitic transistors $P_1$ and $P_2$ exist and provide means for both suppressing their formation and negating their effect even if formed. I accomplish this by means of a new circuit that is monolithically integrated with a unique geometry on a semiconductor chip.

Figure 2:
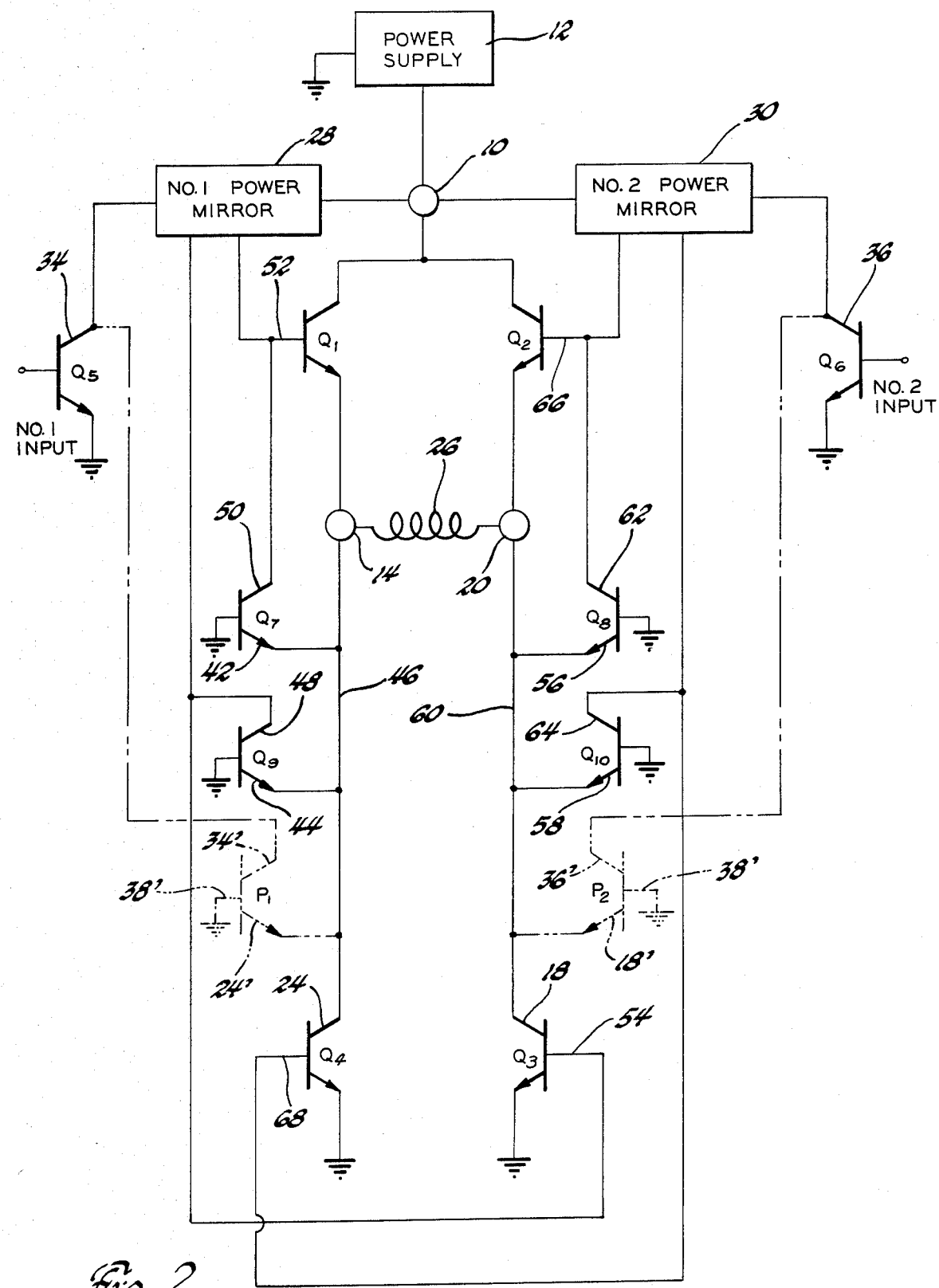
FIG. 2 is a schematic view showing an improved H-switch electrical circuit made in accordance with the invention.

Reference is now made to FIG. 2 which is an electrical schematic showing an H-switch quite similar to that shown in FIGS. 1, 3 and 4. However, the circuit of FIG. 2 additionally includes transistors $Q_7$ and $Q_9$ for the $Q_1$-$Q_3$ part of the H-switch, and transistors $Q_8$ and $Q_{10}$ for the $Q_2$-$Q_4$ part of the H-switch. The balance of the circuit is schematically similar. Hence, it includes a power supply 12, a contact 10, first and second power mirror circuitry 28 and 30, first and second input transistors $Q_5$ and $Q_6$, and an inductive load impedance 26. To simplify FIG. 2, the power mirror circuitry is represented by labelled boxes 28 and 30. As can be seen, transistors $Q_7$ and $Q_9$ have their emitters 42 and 44 coupled with the bus 46 for the output terminal 14 and their collectors 48 and 50 respectively directly connected to the bases 52 and 54 of load energizing transistors $Q_1$ and $Q_3$. Analogously, transistors $Q_8$ and $Q_{10}$ have their emitters 56 and 58 directly connected to the bus 60 for the other output terminal 20. Their collectors 62 and 64 are respectively directly connected to the bases 66 and 68 of the load energizing transistors $Q_2$ and $Q_4$.

As with the circuit schematically shown in FIG. 1, an input signal applied to input transistor $Q_5$ turns on load energizing transistors $Q_1$ and $Q_3$. Applying an input signal to input transistor $Q_6$ turns on the load energizing transistors $Q_2$ and $Q_4$. Normally, an input signal would be alternatively applied to $Q_5$ or $Q_6$. When $Q_2$ and $Q_4$ are energized by means of an input signal applied to $Q_6$, the output terminal 20 would become more positive than output terminal 14. When the input signal to $Q_6$ is terminated, the energy stored in the inductive load 26 causes the polarity on output terminals 20 and 14 to reverse, with output terminal 20 going lower than ground. As hereinbefore described, in a PN junction-isolated monolithic integration of such a circuit, the polarity reversal would tend to form parasitic lateral NPN transistor $P_2$ with the isolation pocket 18 of $Q_3$. However, the additional transistors $Q_8$ and $Q_{10}$ can collect a portion of the stored energy, which reduces collection by parasitic transistor $P_2$. In substance, when terminal 20 becomes strongly negative, the collector becomes the emitter 18' of parasitic transistor $P_2$ and the emitters 56 and 58, respectively, of transistors $Q_8$ and $Q_{10}$.

In addition, it is to be noted that the collectors 62 and 64 of transistors $Q_8$ and $Q_{10}$ are respectively directly connected to the base regions 66 and 68 of load energizing transistors $Q_2$ and $Q_4$. Consequently, even if there is still some substrate injection by parasitic transistor $P_2$ that tends to keep $Q_2$ and $Q_4$ on, the effect is neutralized by $Q_8$ and $Q_{10}$ which are biased to turn them hard off. Accordingly, the additional transistors $Q_8$ and $Q_{10}$ not only reduce the current collected by the parasitic transistor $P_2$, but also protect against the effects of the parasitically collected current. Hence, load energizing transistors $Q_2$ and $Q_4$ are more rapidly turned off.

Analogous effects are obtained on load energizing transistors $Q_1$ and $Q_3$ by means of transistors $Q_7$ and $Q_9$ upon turn-off of the input transistor $Q_5$. In such event, when an input signal to $Q_5$ is discontinued, current collection by the parasitic transistor $P_1$ is reduced. However, to the extent that it does occur, its effect is negated. Hence, $Q_1$ and $Q_3$ can be more rapidly turned off also. Since more rapid turn-off of the transistor pairs is achieved, the circuit can be switched more rapidly.

Figure 5:
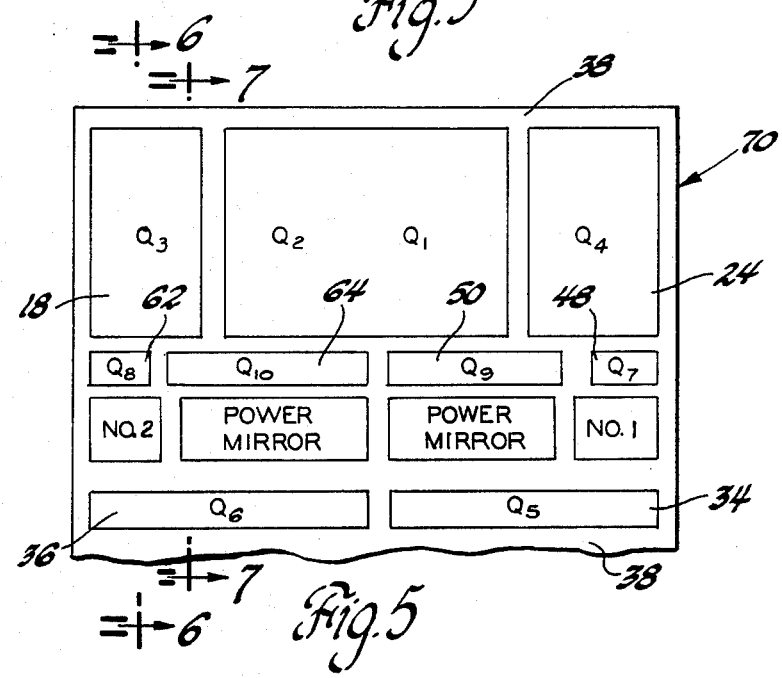
FIG. 5 is a fragmentary plan view showing my improved layout for a PN junction isolated monolithic integrated H-switch.
Figures 6, 8:
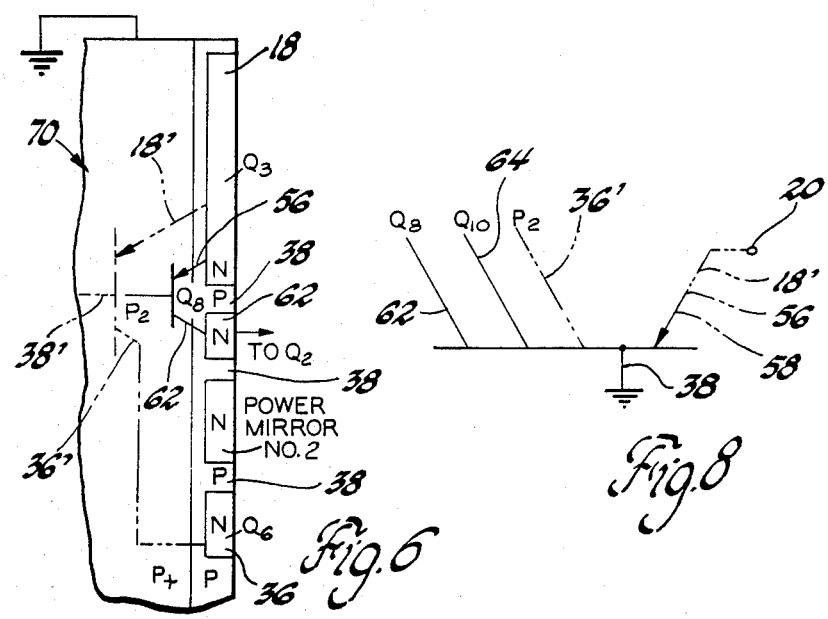
FIG. 6 is a sectional view along the line 6—6 of FIG. 5.
FIG. 8 is a schematic view showing a multiple collector transistor.
Figure 7:
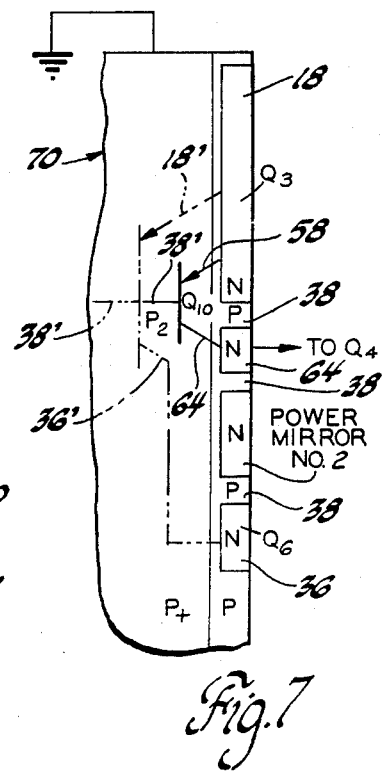
FIG. 7 is a sectional view along the line 7—7 of FIG. 5.

Reference is now made to FIGS. 5, 6 and 7 which show a distinctive geometrical layout for the FIG. 2 circuit on the surface of a silicon chip 70. FIGS. 5, 6 and 7 have been simplified in the same way and for the same reasons as hereinbefore mentioned in connection with FIGS. 3 and 4. In substance, they merely show the isolation pockets used in integrating the circuit because that is all that need be shown to illustrate the invention. A significant feature of transistors $Q_7$, $Q_8$ $Q_9$ and $Q_{10}$ is that although they are shown as NPN transistors, they are not vertical NPN transistors, as is usual. They are lateral NPN transistors. Moreover, they are formed laterally between isolation pockets. $Q_7$, $Q_8$, $Q_9$ and $Q_{10}$ are formed by placing their respective isolation pockets 48, 62, 50 and 64 of N-type material adjacent the isolation pockets 18 and 24 that respectively form the collectors of transistors $Q_3$ and $Q_4$. Hence, they are lateral transistors which use the isolation region 38 as a base region 38', similar to the parasitic transistors $P_1$ and $P_2$. Consequently, there are no successive base and emitter diffusions (not shown) present in the N-type island-like regions 48, 62, 50 and 64, unlike the island-like regions designated for transistors $Q_1$ through $Q_6$.

In FIG. 5, N-type regions 48, 62, 50 and 64 are designated as $Q_7$, $Q_8$, $Q_9$ and $Q_{10}$ only for convenience. It should be recognized that the transistors $Q_7$ and $Q_9$ are formed between the isolation pockets 48 and 50 and the isolation pocket 24 for $Q_4$. Transistors $Q_8$ and $Q_{10}$ are formed between the isolation pockets 62 and 64 and the isolation pocket 18 for load energizing transistor $Q_3$. This is diagrammatically illustrated in the cross-sectional views shown in FIGS. 6 and 7.

Still further, it should be noted that the input transistors $Q_5$ and $Q_6$ would normally be formed in isolation pockets close to the load energizing transistors $Q_3$ and $Q_4$ as illustrated in FIG. 3. In my invention, the input transistors $Q_5$ and $Q_6$ are spaced from the load energizing transistors $Q_3$ and $Q_4$. This increases the efficiency of protection by transistors $Q_7$, $Q_8$, $Q_9$ and $Q_{10}$ and reduces the electrical performance of the parasitic transistors $P_1$ and $P_2$.

Also, I prefer that the current handling characteristics of transistors $Q_7$ and $Q_9$ be similar, as should it be for $Q_8$ and $Q_{10}$. The isolation pocket 48 forming the collector of transistor $Q_7$ is effectively closer to the isolation pocket 24 forming the collector of $Q_4$ than the isolation pocket 50 of $Q_9$ is to it. Consequently, isolation pocket 48 is made smaller than isolation pocket 50. For analogous reasons isolation pocket 62 is made smaller than isolation pocket 64.

Formation of the parasitic transistors $P_1$ and $P_2$ are also suppressed for another reason. It can be seen in FIG. 5 that the protection transistors $Q_7$, $Q_8$, $Q_9$ and $Q_{10}$ form a screen between the load energizing transistors $Q_3$ and $Q_4$ and their respective input transistors $Q_5$ and $Q_6$. It should also be noted that in the configuration shown, the isolation pocket 34 for the input transistor $Q_5$ is spaced a maximum distance away from the isolation pocket 24 for load energizing transistor $Q_4$ with which it would form the parasitic transistor $P_1$. The isolation pockets 48 and 50 of protection transistors $Q_7$ and $Q_9$ are interposed therebetween. Analogously, the isolation pocket 36 of input transistor $Q_6$ is separated from the isolation pocket 18 forming the collector for load energizing transistor $Q_3$, with the isolation pockets 62 and 64 of protection transistors $Q_8$ and $Q_{10}$ interposed therebetween.

It should also be noted that protection transistors $Q_8$ and $Q_{10}$ and parasitic transistor $P_2$ could be schematically shown as a multiple collector NPN transistor, as shown in FIG. 8, since each of $Q_8$, $Q_{10}$ and $P_2$ have the same base region and their emitters 18', 56 and 58 are the same. Transistors $Q_7$, $Q_9$ and $P_1$ could be analogously formed for analogous reasons. They are only shown as discrete devices in FIGS. 1 and 2 for purposes of illustration.

I wish to also point out that this invention has been explained in connection with an H-switch. However, it is to be understood that similar effects can be obtained on any PN junction-isolated monolithic integrated circuit whose turn-off is delayed by parasitic transistor action. Accordingly, the principles of this invention are not limited to the H-switch power circuit shown.

The embodiments of the invention in which an exclusive property or privilege is claimed are defined as follows:

1. In a PN junction-isolated bipolar integrated circuit having three mutually spaced isolation regions respectively forming the collectors of a power transistor, a driver transistor for the power transistor, and another transistor whose collector is subject to unwanted polarity reversal, which reversal could produce parasitic substrate injection of current collectible by the driver transistor collector that, in turn, could produce unwanted drive current for the power transistor, the improvement comprising a fourth isolation pocket disposed between the driver transistor pocket and the other transistor pocket, the fourth isolation pocket not containing any opposite conductivity type regions, and a low resistance electrical connection between the fourth isolation pocket and a base region of the power transistor that is the only electrical contact formed on the pocket, effective both to reduce the parasitic substrate injection from the other transistor to the driver transistor and to negate parasitic base drive to the power transistor when the unwanted polarity reversal occurs.

2. In a PN junction-isolated bipolar integrated circuit having three mutually spaced N-type silicon pockets formed in a P-type silicon substrate, the N-type pockets respectively forming the collectors for three discrete vertical NPN transistors, one of which is a power transistor, the second of which is a driver transistor for the power transistor, and the third of which is subject to a transient reversal of polarity on its collector when the power transistor is turned off, which transient polarity reversal produces a corresponding parasitic substrate injection to the driver transistor and an attendant parasitic base drive to the power transistor when the driver transistor is turned off, the improvement in which a fourth pocket of N-type silicon is provided in the P-type silicon substrate, the fourth pocket is spaced from the other three pockets, the fourth pocket contains no opposite conductivity type regions and is disposed between the second and third transistor pockets, and a low resistance electrical connection is provided between the fourth pocket and a base drive contact on the power transistor, whereby the power transistor is turned hard off even when the parasitic substrate injection takes place.

3. In a PN junction isolated monolithic integrated H-switch circuit for energizing an inductive load, which circuit includes two outputs for energizing the load, two pairs of load energizing transistors respectively coupled across the outputs for switching of electrical potentials on the outputs from one polarity arrangement to an opposite polarity arrangement, a driver transistor having its collector coupled to base regions on each load energizing transistor pair, and for each pair a normally reverse poled first junction isolation diode that is subject to an unwanted forward poling upon turn off of a load energizing transistor in that pair, which forward poling is effective to form a parasitic emitter for the driver transistor collector of that pair upon driver transistor turn-off that delays turn-off of the load energizing transistors of that pair, the improvement comprising second and third normally reverse poled junction isolation diodes for that pair disposed between the first isolation diode and the driver transistor collector and respectively coupled to the base region of each load energizing transistor of that pair, effective to reduce parasitic collection by the driver transistor for that pair and to induce more rapid turn-off of the load energizing transistor in that pair.

4. A faster turn-off PN junction-isolated monolithic integrated H-switch circuit on a silicon chip for energizing an inductive load comprising:
  a silicon chip;
  two outputs on the chip for energizing an inductive load;
  two contacts on the chip for respective coupling to opposite poles of a power supply;
  four load energizing transistors on the chip, each having an emitter, base and collector;
  one of the contacts coupled in parallel to both of the outputs through the emitter and collector of two of the load energizing transistors;
  the other of the contacts coupled in parallel to both of the outputs through the emitter and collector of the other two load energizing transistors, whereby alternatively turning on diagonally opposite pairs of load energizing transistors alternatively switches polarity of electrical potential applied to the outputs;
  two input transistors on the chip, each having its collector coupled to the bases of one diagonally opposite pair of load energizing transistors;
  at least four PN junction-isolation pockets on the chip not containing opposite conductivity type regions and not subject to forward poling upon turn off of a load energizing transistor, with each pocket respectively coupled with the base of one load energizing transistor; and
  the PN junction-isolation pockets coupled with one load energizing transistor pair being disposed on the silicon chip between the load energizing transistors of the other pair and the input transistor for the one pair, whereby less current can be parasitically emitted to either input transistor collector when that input transistor is turned off and base region potential on the corresponding load energizing transistor pair is more rapidly lowered.

5. A faster turn-off junction-isolated monolithic integrated H-switch circuit on a silicon chip for energizing an inductive load comprising:
  a P-type silicon substrate;
  two outputs on the substrate for energizing an inductive load;
  two contacts on the substrate for respective coupling to opposite poles of a power supply;
  four load energizing NPN junction disposed on a line on the substrate, each transistor having an N-type isolation pocket as its collector and the middle two load energizing transistors sharing the same isolation pocket;
  one of the contacts parallely coupled to both of the outputs across the emitters and collectors of the middle two of the load energizing transistors, the other of the contacts parallely coupled to both of the outputs across the emitters and collectors of the other two of the load energizing transistors;
  a first NPN driver transistor on the substrate having an N-type isolation pocket as its collector, with the pocket coupled to base drive circuitry for two of each of the middle two and other load energizing transistors, for oppositely poling the outputs;
  a second NPN driver transistor on the substrate having an N-type isolation pocket as its collector, with the pocket coupled to base drive circuitry for the remaining two load energizing transistors, for reversing the opposite poling of the outputs;
  the driver transistor isolation pockets oppositely disposed on the substrate from the unshared pocket load transistors they drive, on a line generally parallel the load transistor line;
  four isolation pockets disposed on the substrate on a line generally between and parallel the lines of the load energizing transistors and driver transistors and not containing any opposite conductivity type regions, with the two pockets most closely adjacent each of the driver transistors respectively coupled to the base regions of the load energizing transistors it drives, whereby a portion of current parasitically injected into the substrate from the unshared pocket of a first pair of load energizing transistors being turned off is collected before reaching the driver transistor isolation pocket for the other pair, and used to turn the first pair of load energizing transistors hard off when its driving circuitry is turned off, to compensate for the portion tending to delay turn-off.

* * * * *